(12) United States Patent
Kim et al.

(10) Patent No.: US 7,988,812 B2
(45) Date of Patent: Aug. 2, 2011

(54) SUBSTRATE TREATMENT APPARATUS

(75) Inventors: Ki-Sang Kim, Yongin-si (KR); Kyue-Sang Choi, Seoul (KR); Byong-Kyu Seo, Suwon-si (KR); Soon-Chon Park, Gyeongsangnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1190 days.

(21) Appl. No.: 11/711,124

(22) Filed: Feb. 27, 2007

(65) Prior Publication Data

US 2007/0217896 A1 Sep. 20, 2007

(30) Foreign Application Priority Data

Mar. 3, 2006 (KR) ........................ 10-2006-0020304

(51) Int. Cl.
*C23F 1/00* (2006.01)
*C23C 16/00* (2006.01)
*H01L 21/306* (2006.01)

(52) U.S. Cl. .............. 156/345.32; 156/345.31; 118/719; 414/935

(58) Field of Classification Search ............. 156/345.31, 156/345.32; 118/719; 414/939, 935
See application file for complete search history.

(56) References Cited

U.S. PATENT DOCUMENTS

| | | | | |
|---|---|---|---|---|
| 5,695,564 A | * | 12/1997 | Imahashi ................. | 118/719 |
| 5,934,856 A | * | 8/1999 | Asakawa et al. ........... | 414/217 |
| 6,503,365 B1 | * | 1/2003 | Kim et al. ................ | 156/345.32 |
| 6,692,649 B2 | * | 2/2004 | Collison et al. ........... | 216/67 |
| 2005/0111936 A1 | | 5/2005 | Kim et al. | |
| 2005/0220576 A1 | | 10/2005 | Kim et al. | |

FOREIGN PATENT DOCUMENTS

| | | | |
|---|---|---|---|
| JP | 04271139 A | * | 9/1992 |
| JP | 11-045929 | | 2/1999 |
| JP | 2004-265894 | | 9/2004 |
| KR | 10-2002-0063664 | | 8/2002 |
| KR | 10-2005-0045191 | | 5/2005 |
| KR | 10-2005-0072621 | | 7/2005 |

OTHER PUBLICATIONS

English Translation of JP 04271139 (Hosooka), Apr. 2010.*

* cited by examiner

*Primary Examiner* — Karla Moore

(74) *Attorney, Agent, or Firm* — Lee & Morse, P.C.

(57) ABSTRACT

A substrate treatment apparatus is provided. The substrate treatment apparatus includes a process room, a load port in which a container receiving wafers is disposed, and a wafer transfer module disposed between the load port and the process room to transfer the wafers between the load port and the process room. The wafer transfer module includes a first barrier, a second barrier extending from a first end of the first barrier or from a portion near the first end of the first barrier at a predetermined inclined angle with respect to the first barrier, and a third barrier extending from a second end of the first barrier or from a portion near the second end of the first barrier at a predetermined inclined angle. The load portion is provided along the first barrier. The process room includes a plurality of chambers arranged along the second and third barriers.

18 Claims, 14 Drawing Sheets

SUBSTRATE TREATMENT APPARATUS

BACKGROUND OF THE INVENTION

1. Field of the Invention

The present invention disclosed herein relates to an apparatus for treating substrates, and more particularly, to an apparatus for treating substrates in an efficient manner.

2. Description of the Related Art

In order to manufacture a semiconductor device, a variety of processes such as deposition, etching and ashing are performed. A conventional substrate treatment apparatus may have a process room that may include a transfer chamber, a robot in the center of the transfer chamber, a plurality of process chambers disposed around the transfer chamber, and a plurality of load lock chambers disposed in front of the transfer chamber. An equipment front end module may be provided in front of the process room. The equipment front end module may transfer wafers between containers disposed on load ports and the process room. The wafers may be received in the load lock chambers, which may include a vacuum atmosphere, by a robot provided in the equipment front end module, and then may be transferred to the process chambers by the robot provided in the transfer chamber.

When the processes are performed using the conventional substrate treatment apparatus, described above, the wafers may be sequentially transferred to the containers, the equipment front end module, the load lock chambers, the transfer chambers, and the process chambers. When the conventional substrate treatment apparatus is used to perform a series of sequential processes, the process chambers, where the processes are performed, may be paired. That is, when first and second processes are performed sequentially, the conventional substrate treatment apparatus may include a number of first process chambers for performing the first process and a number of second process chambers for performing the second process, in which the number of first process chambers is equal to the number of second process chambers.

Therefore, for example, when the time required for performing the second process is shorter than that required for performing the first process, the amount of time that the second process chambers are idle may be increased. Alternatively stated, the second process chambers may be operated less than the first process chambers. Thus, the sequential processing of the conventional art may be quite time consuming and inefficient. In addition, an increase in the number of paired process chambers may result in an increase of the area required to install the apparatus.

SUMMARY OF THE INVENTION

The present invention is therefore directed to a substrate treatment apparatus that is configured to effectively treat substrates, which substantially overcomes one or more of the problems due to the limitations and disadvantages of the related art.

It is therefore a feature of an embodiment of the present invention to provide a substrate treatment apparatus that has a relatively small installation area.

It is therefore another feature of an embodiment of the present invention to provide a substrate treatment apparatus that reduces process times.

It is therefore another feature of an embodiment of the present invention to provide a substrate treatment apparatus that improves the operating ratio of the process chambers.

At least one of the above and other features and advantages of the present invention may be realized by providing a substrate treatment apparatus including a process room, a load port in which a container receiving wafers is disposed, and a wafer transfer module disposed between the load port and the process room and equipped with a robot to transfer the wafers between the load port and the process room. The wafer transfer module may include a first barrier, a second barrier extending from a first end of the first barrier at a predetermined angle with respect to the first barrier, and a third barrier extending from a second end of the first barrier at a predetermined angle with respect to the first barrier. The load port may be provided along the first barrier. The process room may include a plurality of chambers arranged along the second and third barriers.

An end of the second barrier opposite from the first barrier may meet with an end of the third barrier opposite from the first barrier, to form a triangle. The first predetermined angle and the second predetermined angle may be equal. The chambers of the process room may be arranged in a "¬"shape.

The process room may include a first transfer chamber, in which a first robot for transferring the wafers is installed, the first transfer chamber being provided on a side of the second barrier, a second transfer chamber, in which a second robot for transferring the wafers is installed, the second transfer chamber being provided on a side of the third barrier, a first process chamber having a first partition facing the first transfer chamber and a second partition facing the second transfer chamber, a second process chamber disposed adjacent the first process chamber and opposite the first transfer chamber, and a third process chamber disposed adjacent the second process chamber and opposite the first transfer chamber.

The first partition of the first process chamber, which faces the first transfer chamber, and the second partition of the first process chamber, which faces the second transfer chamber, may each include an entrance for the transfer of the wafers.

The substrate treatment apparatus may further include a controller for controlling the robots provided in the first and second transfer chambers, wherein a first process performed in the second and third process chambers may be different from a second process performed in the first process chamber, and the controller may control the robots such that the wafers that are processed in the second and third process chambers may be sequentially transferred to the first process chamber.

The substrate treatment apparatus may further include a controller for controlling the robots provided in the first and second transfer chambers, wherein a first process performed in the second and third process chambers may be different from a second process performed in the first process chamber, and the controller may control the robots such that the wafers that are processed in the first process chamber are sequentially transferred to the second and third process chambers.

The process room may perform two processes consecutively, and the first process chamber performs the one of the two processes which is shorter, and the second and third process chambers perform the second of the two processes. The first process chamber may perform an ashing process using plasma, wherein the first process chamber includes an ICP (Inductively Coupled Plasma) source to generate plasma from a reaction gas. The second and third process chambers may perform an etching process.

The process room may further include a fourth process chamber disposed on a side of the first transfer chamber opposite the wafer transfer module, and a fifth process chamber disposed on a side of the second process chamber opposite the wafer transfer module. The process room may perform two processes consecutively, and the first process chamber performs the one of the two processes which is shorter than the second of the two processes. The second through fifth process chambers may perform the second of the two processes. The first process chamber may perform an ashing process using plasma, wherein the first process chamber comprises an ICP (Inductively Coupled Plasma) source. The second through fifth process chambers may perform an etching process.

The process room performs two processes consecutively, and the second and third process chambers perform the one of the two processes which has a relatively short process time. The first, fourth and fifth process chambers may perform the second of the two processes, which includes a relatively long process time. The second and third process chambers may perform an ashing process using plasma generated by an ICP (Inductively Coupled Plasma) source, and the first, fourth and fifth process chambers may perform an etching process.

The barriers of the first and second transfer chambers which face the wafer transfer module may include an entrance for the transfer of the wafers, a gate valve for closing and opening the entrances, and a vacuum source connected to the first and second transfer chambers, maintain the interiors thereof at a predetermined vacuum pressure.

The robot provided in each of the transfer chambers and the one or more robots provided in the wafer transfer module transfer wafers between each other. One or more of the transfer chamber robots may have a substantially straight and linear blade on which the wafer is disposed, and the one or more wafer transfer module robots may have a C-shaped blade on which the wafer is disposed.

Each of the robots may include a lower arm pivotally attached to the substrate apparatus, an upper arm pivotally coupled to the lower arm, the upper arm being independently driven with respect to the lower arm, and a hand unit pivotally coupled to the upper arm, the hand unit being independently driven with respect to the lower and upper arms. The hand unit may include a coupling rod pivotally coupled to the upper arm, and one or more blades provided on respective opposite ends of the coupling rod, on which the wafer is disposed.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
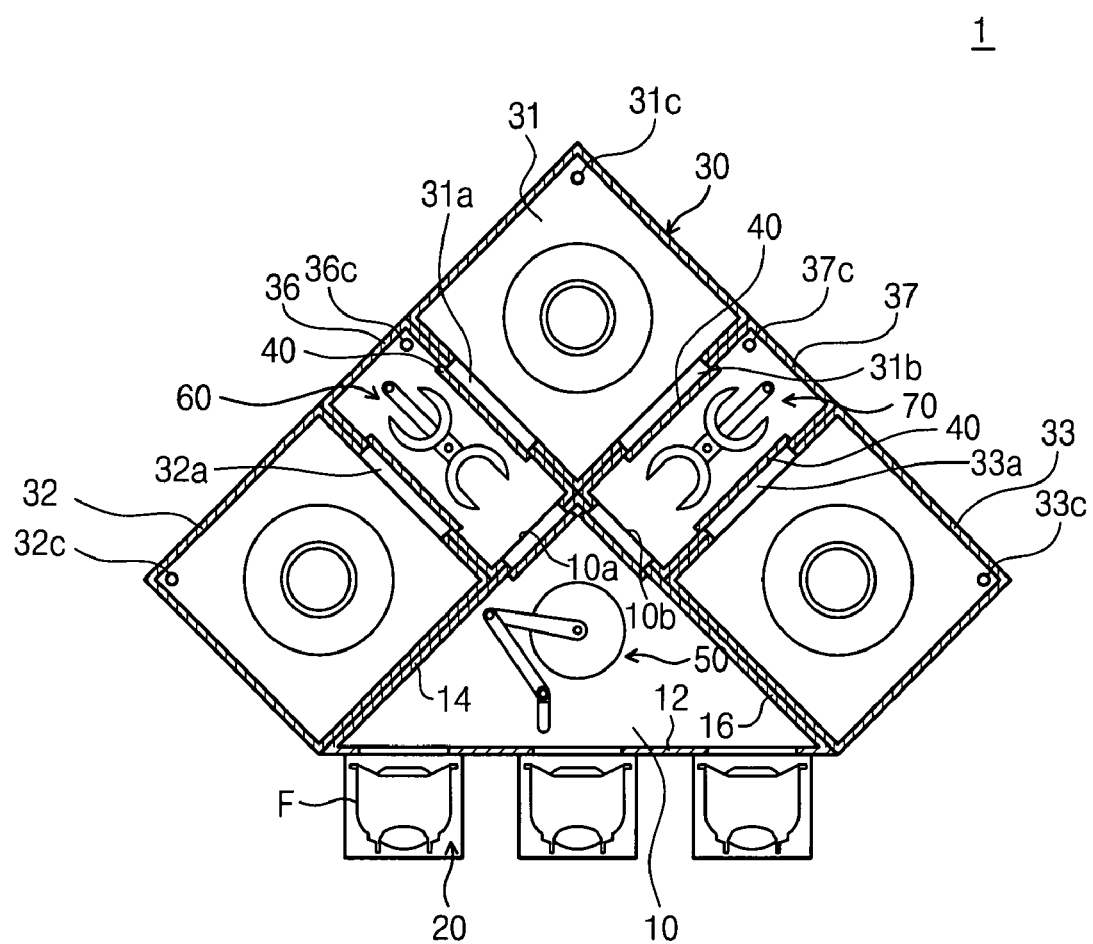
FIG. 1 illustrates a schematic plan view of a substrate treatment apparatus according to an embodiment of the present invention.

Korean Patent Application No. 10-2006-0020304, filed on Mar. 3, 2006, in the Korean Intellectual Property Office, and entitled: "Substrate Treatment Apparatus," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic view of a substrate treatment apparatus according to an embodiment of the present invention. Referring to FIG. 1, a substrate treatment apparatus 1 may include a substrate transfer module 10, a plurality of load ports 20, and a process room 30. Wafers may be loaded onto a container F and transferred to the substrate treatment apparatus 1. The container F may be disposed in the load port 20 by a transfer unit (not shown), e.g., an overhead transfer, or by a worker. A front open unified pod having a door (not shown) for providing an enclosed space may be used as the container F. The process room 30 may be provided for treatment of the wafers W. The wafer transfer module 10 may be disposed between the load port 20 and the process room 30 to transfer the wafers W from the container F to the process room 30 or vice versa.

The wafer transfer module 10 may include first, second and third barriers 12, 14 and 16. The first barrier 12 may be disposed adjacent load ports 20. The second barrier 14 may extend from a first end of the first barrier 12 or from a portion near the first end of the first barrier 12 at a predetermined angle. The third barrier 16 may extend from a second end of the first barrier 12 or from a portion near the second end of the first barrier 12 at a predetermined angle. The second and third barriers 14, 16 may be disposed such that adjacent ends thereof meet each other. That is, the second and third barriers 14, 16 may extend from opposite ends of the first barrier 12, and distal ends of the second and third barriers 14, 16 may abut. The arrangement of the first, second and third barriers 12, 14 and 16 may form a triangular shape, e.g., a right triangle, when viewed from above, as can be seen in FIG. 1.

A robot 50 may be installed in the wafer transfer module 10. The robot 50 may transfer the wafers W from the container F to the process room 30 or vice versa. Hereinafter, the robot 50 installed in the wafer transfer module 10 will be referred to as "module robot."

A fan filter unit (not shown) through which external fresh air may be introduced may be provided atop the wafer transfer module 10. In addition, a door opener (not shown) for automatically opening and closing the door of the container F may be provided in the wafer transfer module 10.

One or more load ports 20 may be disposed on a side of the first barrier 12. When a plurality of load ports 20 are provided, the load ports 20 may be arranged in a line along the first barrier 12. The process room 30 may have a plurality of process chambers 31, 32 and 33, and a plurality of transfer chambers 36 and 37. The process chambers 31, 32 and 33, and transfer chambers 36 and 37, may be arranged along the second and third barriers 14, 16. The first process chamber 31 may be symmetrically arranged relative to the vertex of the wafer transfer module 10. The second process chamber 32 may be provided along the second barrier 14, and adjacent the first barrier 12. The third process chamber 33 may be provided along the third barrier 16, and adjacent the first barrier 12. The first transfer chamber 36 may be arranged along the second barrier 14 between the first and second process chambers 31 and 32. The second transfer chamber 37 may be arranged along the third barrier 16 between the first and third process chambers 31 and 33. Thus, the process and transfer chambers 31, 32, 33, 36, and 37 may be arranged in an inverted-V shape.

Each of the process chambers 31, 32 and 33 may be formed in a rectangular shape when viewed from above. Likewise, each of the transfer chambers 36 and 37 may also be formed in a rectangular shape when viewed from above.

FIG. 1 illustrates an exemplary embodiment having one process chamber and one transfer chamber on each of the second and third barriers 14, 16, however, the present invention is not limited to this. In another embodiment, a plurality of process chambers and a plurality of transfer chambers may be provided on each of the second and third barriers 14, 16. The transfer chambers may be disposed between the process chambers.

A first chamber 60 may be installed in the first transfer chamber 36 to transfer the wafers W among the first process chamber 31, the second process chamber 32 and wafer transfer module 10. A second chamber robot 70 may be installed in the second transfer chamber 37 to transfer the wafers W among the first process chamber 31, the third process chamber 33 and wafer transfer module 10. The first and second chamber robots 60, 70 may be identical in form and structure to each other. The first chamber robot 60 and the module robot 50 may be configured to give and take wafers W to and from each other. The second chamber robot 70 and the module robot 50 may also be configured to give and take wafers W to and from each other. Towards that end, the first chamber robot 60 may include a C-shaped blade, and the module robot 50 may include a substantially straight, narrow blade, which will be discussed for FIGS. 2 and 3.

Figure 2:
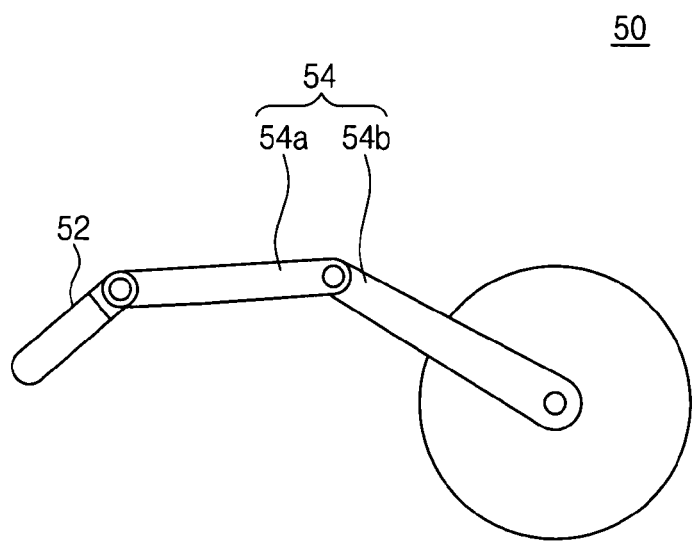
FIG. 2 illustrates a schematic plan view of a module robot according to an embodiment of the present invention.

FIG. 2 schematically illustrates the module robot 50. Referring to FIG. 2, the module robot 50 may include a blade 52 and an arm 54. The arm 54 may include an upper arm 54a and a lower arm 54b. The upper and lower arms 54a and 54b may be coupled to each other by a pivot shaft (not shown), so that the upper arm 54a may pivot around the pivot shaft relative to the lower arm 54b. The blade 52 and the upper arm 54a may be coupled to each other by a pivot shaft (not shown), so that the blade 52 may pivot around the pivot shaft with respect to the upper arm 54a. The blade 52 may include a substantially straight and narrow shape, and may retain the wafer W using vacuum pressure. The module robot 50 may further include a driving motor (not shown). The upper and lower arms 54a and 54b and the blade 52 may be operated through a combination of pulleys (not shown) and belts (not shown).

Figure 3:
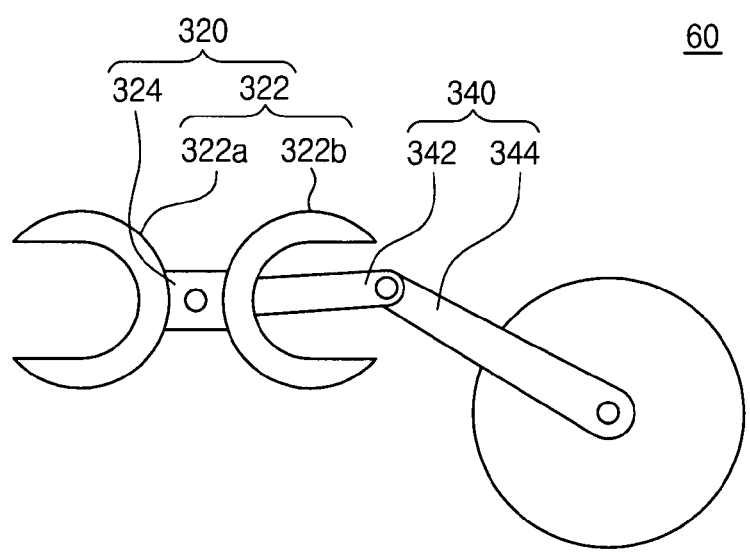
FIG. 3 illustrates a schematic plan view of a first chamber robot according to an embodiment of the present invention.
Figure 4:
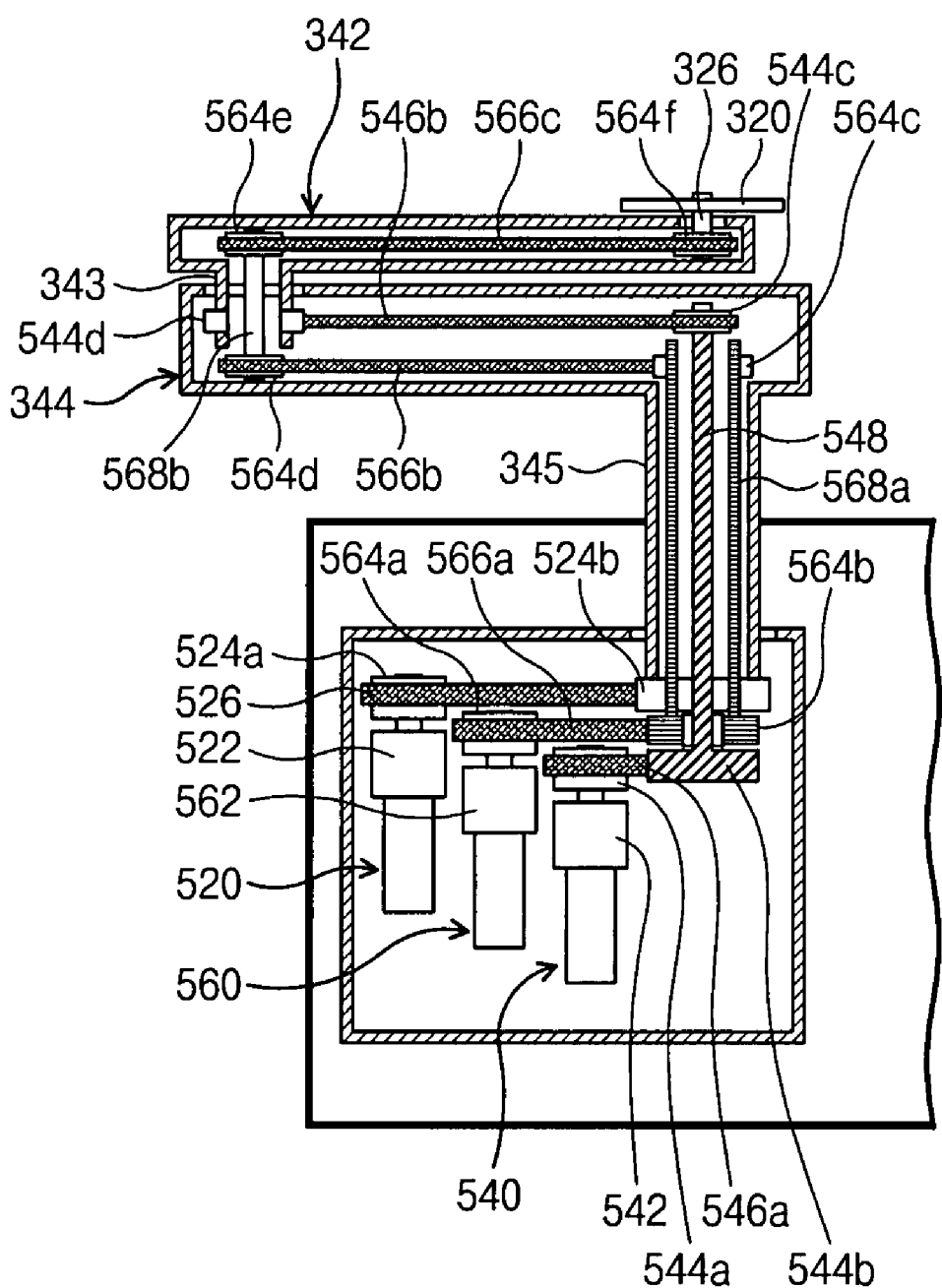
FIG. 4 illustrates a longitudinal sectional view of the first chamber robot of FIG. 3.

FIG. 3 illustrates a top view of the first chamber robot 60 and FIG. 4 illustrates a longitudinal sectional view of the first chamber robot 60. Since the second chamber robot 70 may be identical in form and structure to the first chamber 60, only the first chamber robot 60 will be described in the following description. Referring to FIGS. 3 and 4, the first chamber robot 60 may include an arm unit 340 and a hand unit 320.

The hand unit 320 may include a connecting rod 324 and blades 322 installed on respective opposite ends of the connecting rod 324. Each of the blades 322 may be formed in a C-shape to support the wafer W. Each of the blades 322 may retain the wafer W using vacuum pressure.

The arm unit 340 may be provided to move the hand unit 320. The arm unit 340 may include an upper arm 342 and a lower arm 344. The upper arm 342 may have a first end coupled to a center portion of the connecting rod 324 of the hand unit 320, and the lower arm 344 may have a first end connected to a second end of the upper arm 342. The hand unit 320 may be rotatable about the position where the connecting rod 324 couples to the upper arm 242, and the upper arm 242 may be rotatable about its coupling to the lower arm 344.

FIG. 4 illustrates an arm-driving unit for rotating the hand unit 320, upper arm 342, and lower arm 344, respectively. The arm-driving unit may include a lower arm driving unit 520, an upper arm driving unit 540, and a hand unit driving unit 560.

A lower arm connecting shaft 345 may extend downward from the first end of the lower arm 344, and may be rotated by the lower arm driving unit 520. The lower arm driving unit 520 may include a driving motor 522, a first lower pulley 524a, a second lower pulley 524b, and a lower belt 526. The first lower pulley 524a may be rotatably connected to the driving motor 522. The second lower pulley 524b may be installed on a first end of the lower arm connecting shaft 345. The second lower pulley 524b may be integrally formed with the lower arm connecting shaft 345. Alternatively, the second lower pulley 524b may be a separate part that may be coupled to the lower arm connecting shaft 345. The lower belt 526 may be connected to the first and second lower pulleys 524a, 524b to transmit the rotational force of the driving motor 522 to the lower arm connecting shaft 345.

An upper arm connecting shaft 343 may extend downward from the first end of the upper arm 342, and may be coupled to the lower arm 344. The upper arm driving unit 540 may rotate the upper arm 342 around the upper arm connecting shaft 343 on the lower arm 344. The upper arm driving unit 540 may include a driving motor 542, a first upper pulley 544a, a second upper pulley 544b, a first upper belt 546a, a third upper pulley 544c, a fourth upper pulley 544d, a second upper belt 546b, and a first rotational shaft 548. The first upper pulley 544a may be rotatably connected to the driving motor 542. The first rotational shaft 548 may be inserted in the lower arm connecting shaft 345. The second upper pulley 544b may be coupled to a first end of the first rotational shaft 548 and the third upper pulley 544c may be coupled to a second end of the first rotational shaft 548. The first upper belt 546a may be connected to the first and second upper pulleys 544a and 544b to transmit the rotational force of the driving motor 542 to the first rotational shaft 548. In addition, the fourth upper pulley 544d may be arranged on an end of the upper arm connecting shaft 343. The fourth upper pulley 544d may be integrally formed with the upper arm connecting shaft 343. Alternatively, the fourth upper pulley 544d and the upper arm connecting shaft 343 may be formed separately and then coupled to each other. The second upper belt 546 may transmit the rotational force of the first rotational shaft 548 to the upper arm connecting shaft 343.

A hand unit connecting shaft 326 may be formed in a rod-shape, and may have a first end connected to the center of the connecting rod 324 and a second end connected to the upper arm 342. The hand unit driving unit 560 may rotate the hand unit 320 around the hand unit connecting shaft 326 on the upper arm 342. The hand unit driving unit 560 may include a driving motor 562, a first hand unit pulley 564a, a second hand unit pulley 564b, a first hand unit belt 566a, a third hand unit pulley 564c, a fourth hand unit pulley 564d, a second hand unit belt 566b, a fifth hand unit pulley 564e, a sixth hand unit pulley 564f, a third hand unit belt 566c, a second rotational shaft 568a, and a third rotational shaft 568b. The first hand unit pulley 564a may be rotatably connected to the driving motor 562. The second rotational shaft 568a may be inserted in the lower arm connecting shaft 345, and the first rotational shaft 548 may be inserted in the second rotational shaft 568a. The second rotational shaft 568a may have a first end to which the second hand unit pulley 564b may be coupled and a second end to which the third hand unit pulley 564c may be coupled. The first hand unit belt 566a may be connected to the first and second hand unit pulleys 564a and 564b to transmit the rotational force of the driving motor 562 to the second rotational shaft 568a. The third rotational shaft 568b may be inserted in the upper arm connecting shaft 343. The third rotational shaft 568b may include a first end to which the fourth hand unit pulley 564d is coupled and a second end to which the fifth hand unit pulley 564e is coupled. The second hand unit belt 566b may be connected to the third and fourth hand unit pulleys 564c and 564d to transmit the rotational force of the second rotational shaft 568a to the third rotational shaft 568b. In addition, the sixth hand unit pulley 564f may be connected to the hand unit connecting shaft 326. The third hand unit belt 566c may transmit the rotational force of the third rotational shaft 568b to the hand unit connecting shaft 326. By the above-described arm driving unit, the hand unit 320, upper arm 342, and lower arm 344 may each be driven independently.

In an alternative embodiment, the upper arm 342, lower arm 344 and hand unit 320 of the first chamber robot 60 may be synchronized by a common motor. In a further alternative embodiment, the upper and lower arms 342 and 344 of the first chamber robot 60 may be synchronized by a common motor and the hand unit 320 and arm unit 324 of the first chamber robot 60 may be driven independently.

Referring again to FIG. 1, the wafer transfer module 10 may be provided with an entrance 10a for allowing for the transfer of the wafers W between the first transfer chamber 36 and the wafer transfer module 10, and an entrance 10b for allowing for the transfer of the wafers W between the wafer transfer module 10 and the second transfer chamber 37. In addition, the first process chamber 31 may be provided with an entrance 31a for allowing for the transfer of the wafers W between the first transfer chamber 36 and the first process chamber 31, and an entrance 31b for allowing for the transfer of the wafers W between the second transfer chamber 37 and the first process chamber 31. The second process chamber 32 may be provided with an entrance 32a for allowing for the transfer of the wafers W between the first transfer chamber 36 and the second process chamber 32. The third process chamber 33 may be provided with an entrance 33a for allowing for the transfer of the wafers W between the second transfer chamber 37 and the third process chamber 33.

When the process is performed in each process chamber under a vacuum atmosphere, the entrances 10a, 10b, 31a, 31b, 32a, and 33a of the process and transfer chambers may be closed by respective gate valves 40. Vacuum lines 31c, 32c, 33c, 36c, 37c may be attached to a vacuum pump (not shown) to maintain vacuum states in the respective process and transfer chambers 31, 32, and 33 and 36 and 37.

The first process chamber 31 may include entrances 31a and 31b facing the first and second transfer chambers 36 and 37, so the wafers W may be loaded to and from the first process chamber 31 by the first chamber robot 60 or the second chamber robot 70.

Figure 5:
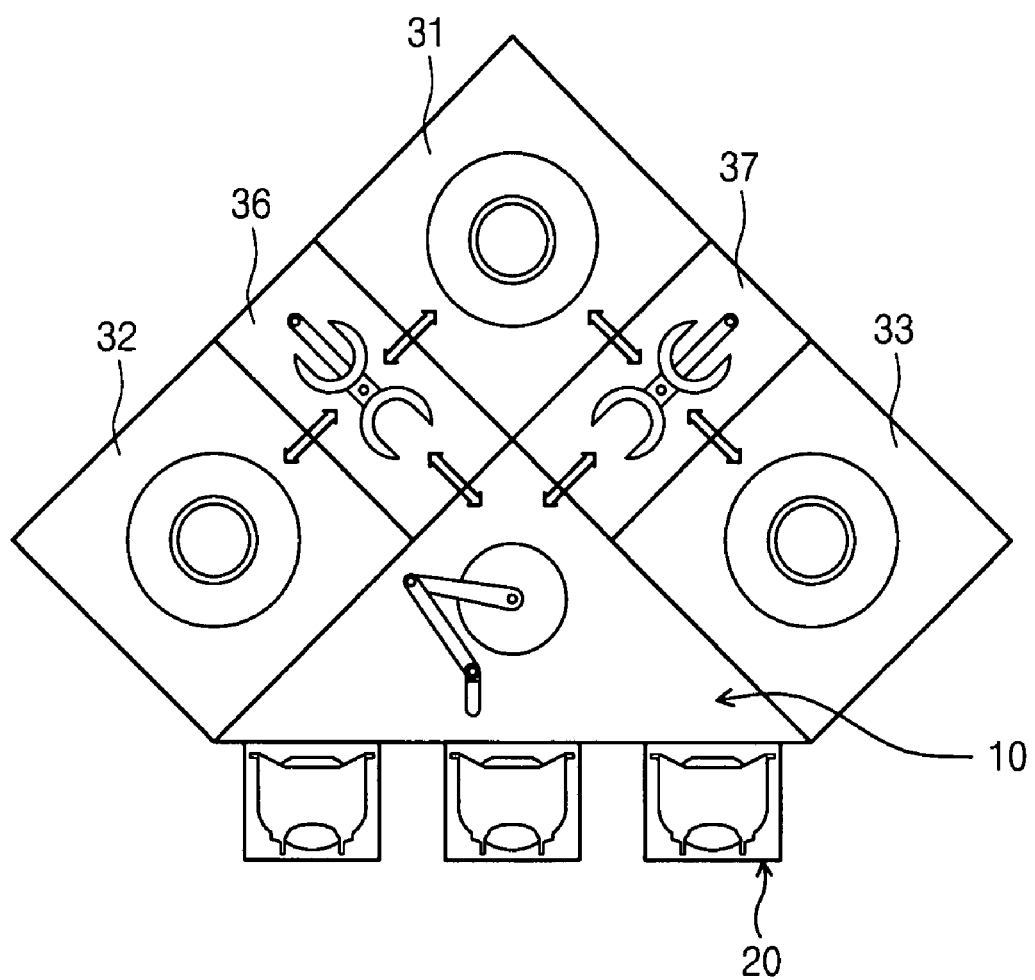
FIG. 5 illustrates a schematic plan view of an example of a wafer transfer path in the apparatus of FIG. 1.

Identical substrate treatment processes may be performed in the first, second and third process chambers 31, 32 and 33. As illustrated in FIG. 5, the transfer of the wafers between the second process chamber 32 and the wafer transfer module 10 may be performed by the first chamber robot 60 and the transfer of the wafers between the third process chamber 33 and the wafer transfer module 10 may be performed by the second chamber robot 70. In addition, the transfer of the wafers W between the first process chamber 31 and the wafer transfer module 10 may be performed by either the first chamber robot 60 or the second chamber robot 70. That is, the transfer of the wafers W between the first process chamber 31 and the wafer transfer module 10 may be performed by whichever of the first and second chamber robots 60 and 70 is not busy.

Figure 6:
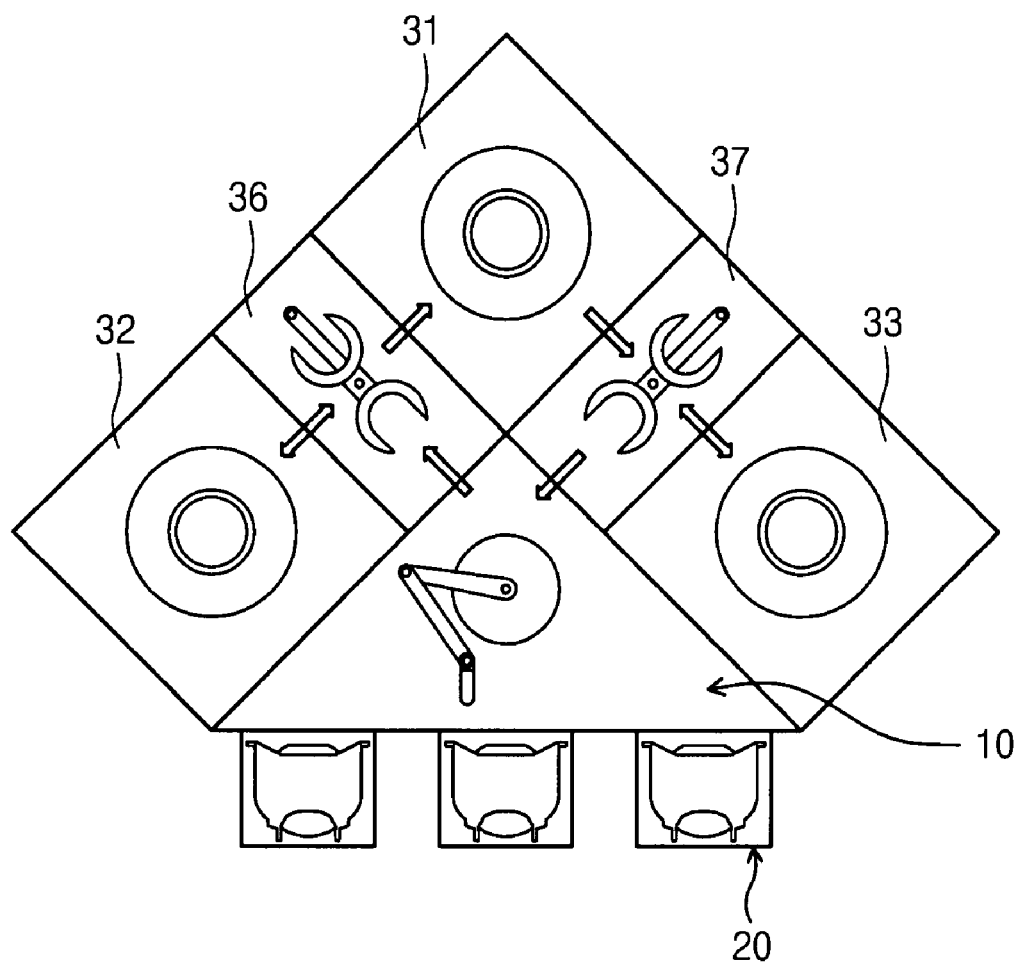
FIG. 6 illustrates a view of another example of a wafer transfer path in the apparatus of FIG. 1.
Figure 7A:
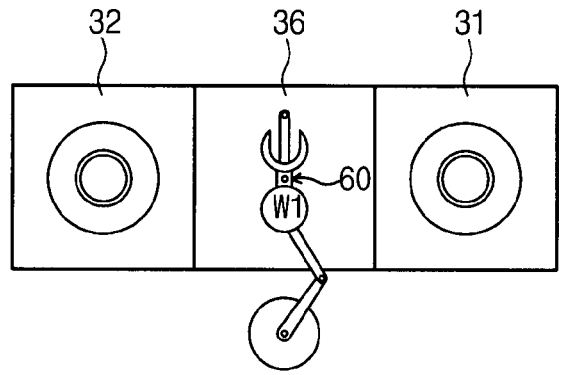
FIGS. 7A-7H illustrate schematic plan views of stages in a process for performing first and second processes using the first chamber robot of FIGS. 3 and 4.
Figure 7B:
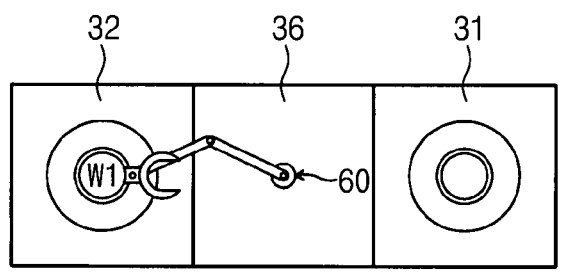
Figure 7C:
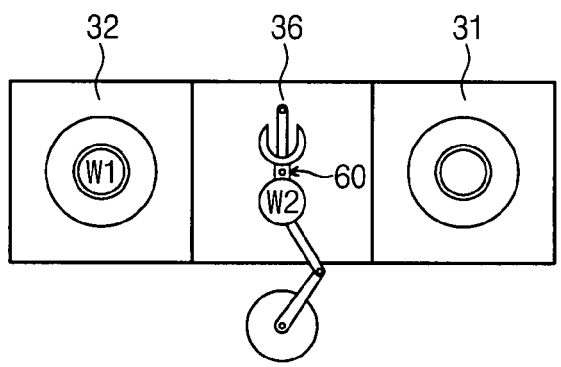
Figure 7D:
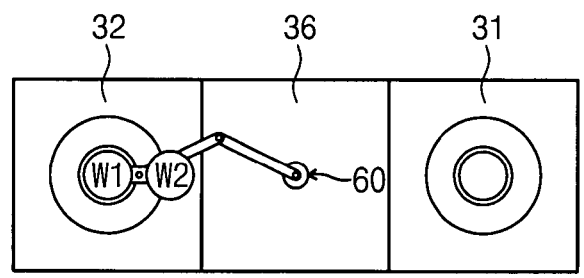
Figure 7E:
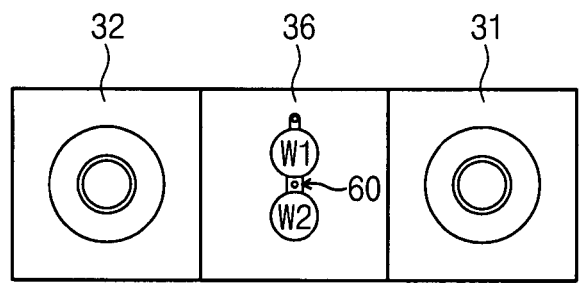
Figure 7F:
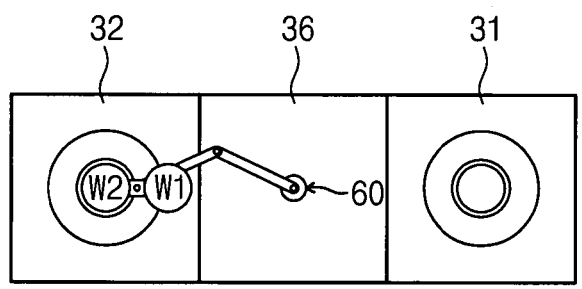
Figure 7G:
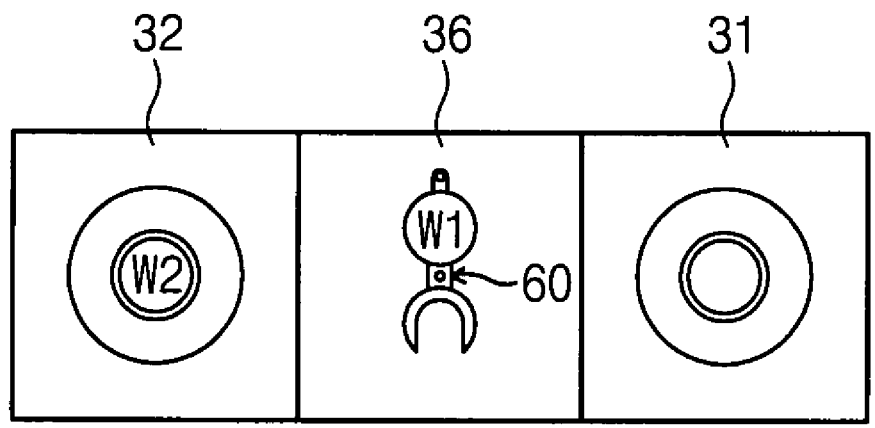
Figure 7H:
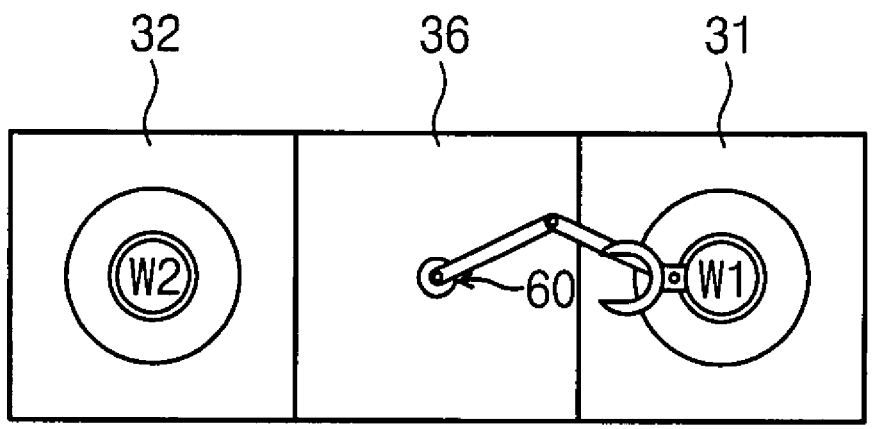

Alternatively, as illustrated in FIG. 6, the wafer transfer from the wafer transfer module 10 to the first process chamber 31 may be accomplished by one of the first and second chamber robots 60 and 70, and the wafer transfer from the first process chamber 31 to the wafer transfer module 10 may be done by the other of the first and second chamber robots 60 and 70.

In accordance with another embodiment of the invention, first and second processes having different process times may be sequentially performed for the wafers W in the process chambers 31, 32 and 33. The first process chamber 31 may perform a first process having a relatively short process time and the second and third process chambers 32 and 33 may perform a second process having a relatively long process time. Thus, when the first process has a shorter process time than the second process and is performed in advance of the second process, the wafer undergoing the first process in the second process chamber 32, and the wafer undergoing the first process in the third process chamber 33 may be alternately transferred from the first process chamber 31 by the first or second chamber robot 60 or 70 to receive the second process treatment.

FIGS. 7A-7H illustrate schematic plan views of stages in a procedure for performing the first and second processes using the first chamber robot of FIGS. 3 and 4. In an exemplary embodiment, the following description provides a case where a process is performed on a wafer W in the second process chamber 32, followed by a process performed on the wafer W in the first process chamber 31. First, FIG. 7A, a first wafer W1 may be disposed on the first blade 322a of the first chamber robot 60 by the module robot 50. Then, FIG. 7B, the first chamber robot 60 may transfer the first wafer W1 to the second process chamber 32. While the process is being performed on the first wafer W1 in the second process chamber 32, in FIG. 7C, a second wafer W2 may be disposed on the second blade 322b of the first chamber robot 60 by the module robot 50. When the process for the first wafer W1 is finished in the second process chamber 32, in FIG. 7D, the first wafer W1 may be transferred from the second process chamber 32 by the first blade 322a, FIG. 7E, and the second wafer W2, disposed on the second blade 322b, may be transferred to the second process chamber 32, FIG. 7F. Next, the process may be performed on the second wafer W2 in the second process chamber 32, FIG. 7G. Further, the first wafer W1, disposed on the first blade 322a, may be transferred to the first process chamber 31, FIG. 7H, and a process may be performed on the first wafer W1 in the first process chamber 31.

A third wafer W3 may be disposed on the first blade 322a of the first chamber robot 60 by the module robot 50. When the process for the first wafer W1 is finished in the first process chamber 31, the first wafer W1 may be transferred to the module robot 50 by the second blade 322b of the first chamber robot 60. The second wafer W2 may then be unloaded from the second process chamber 32 by the second blade 322b of the first chamber robot 60 and the third wafer W3, disposed on the first blade 322a, may be transferred to the second process chamber 32. The second wafer W2, disposed on the second blade 322b, may then be transferred to the first process chamber 31. Then, a fourth wafer W4 may be disposed on the first blade 322a. The above-described procedure may be repeated continuously. The wafer transfer order is exemplary only. The wafer transfer order may be done in any of several different ways according to the needs of the user and the processes involved.

According to the present invention, the first chamber robot 60 may have two blades 322a, 322b. Thus, while one wafer W is being processed in a process chamber, another wafer W may be ready in position to be processed next. Therefore, the process time may be reduced.

Figure 8:
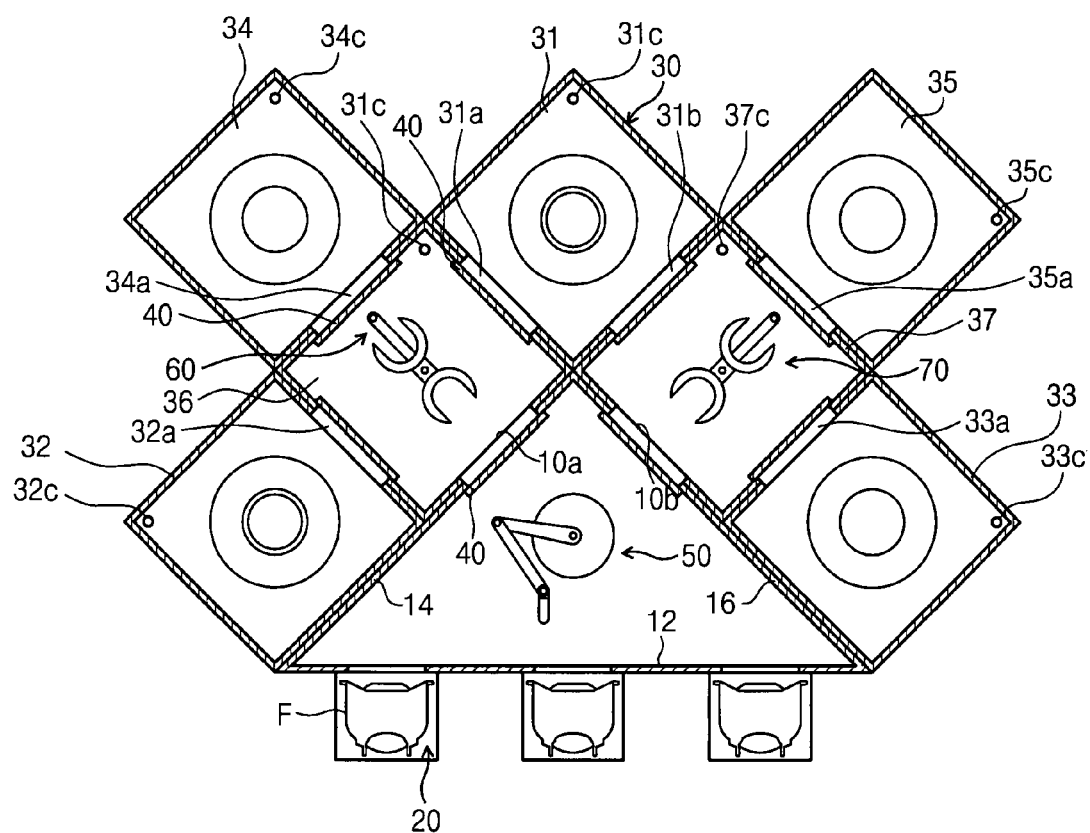
FIG. 8 illustrates a schematic plan view of a substrate treatment apparatus according to another embodiment of the present invention.

FIG. 8 illustrates a view of a substrate treatment apparatus according to another embodiment of the present invention. The substrate treatment apparatus 2 of this embodiment may include a fourth process chamber 34 and fifth process chamber 35 in addition to the chambers illustrated in FIG. 1. The fourth process chamber 34 may be disposed facing the wafer transfer module 10 through the first transfer chamber 36, and the fifth process chamber 35 may be disposed facing the wafer transfer module 10 through the second transfer chamber 37. The fourth process chamber 34 may include an entrance 34a for allowing wafer transfer between the first transfer chamber 36 and the fourth process chamber 34. The fifth process chamber 35 may include an entrance 35a for allowing wafer transfer between the second transfer chamber 37 and the fifth process chamber 35. When the process is performed under a vacuum atmosphere, the entrances 34a and 35a may be closed by respective gate valves 40.

In the above-described substrate treatment apparatus 2, each of the first and second chamber robots 60 and 70 may be configured such that the hand unit 320 and the arm unit 340 are independently driven. In addition, the first and second transfer chambers 36 and 37 may be designed to be large enough to permit the hand unit 320 to rotate 3600 on the arm unit 340 inside the transfer chambers 36, 37.

Identical processes may be performed in the first through fifth process chambers 31 through 35. Alternatively, first and second processes may be consecutively performed in the first through fifth process chambers 31 through 35. A substrate treatment process having a relatively short process time may be performed in one or two process chambers, and a substrate treatment process having a relatively long process time may be performed in the rest of the process chambers.

The following process provides an exemplary embodiment where first and second processes may be performed sequentially, and the first process may have a process time longer than the second process. The second through fifth process chambers 32 through 35 may perform the first process and the first process chamber 31 may perform the second process. Wafers subject to the first process in the second through fifth process chambers 32 through 35 may be alternately transferred to the first process chamber 31 by the first and second chamber robots 60, 70 to undergo the second process.

In accordance with another embodiment, the first, fourth and fifth process chambers 31, 34 through 35 may perform the first process, while and the second and third process chambers 32, 33 may perform the second process. The wafers W subject to the first process in the fourth process chamber 34 may be transferred to the second process chamber 32 by the first chamber robot 60 to undergo the second process. The wafers W subject to the first process in the fifth process chamber may be transferred to the third process chamber 33 by the second chamber robot 70 to undergo the second process. The wafers W subject to the first process in the first process chamber 31 may be alternately transferred to either the second process chamber 32 or the third process chamber 33 by either the first chamber robot 60 or the second chamber robot 70 to undergo the second process. Alternatively, the wafers W subject to the first process in the first process chamber 31 may be transferred to one of the second and third process chambers 32, 33, where no process is being performed, to undergo the second process.

In one embodiment, the first process chamber 31 may be provided with entrances 31a, 31b to allow the wafer to be transferred to the first process chamber 31 by the first and second chamber robots 60, 70. Alternatively, the first process chamber 31 may be provided with only entrance so that the wafer W may be loaded or unloaded from the first process chamber 31 by only one of the first and second chamber robots 60, 70.

The following will describe the schematic structure and transfer process of the wafers W within the substrate treatment apparatus 1, in which examples of the etching and ashing processes will be provided. The etched layer on the wafer W may be a metal layer. The metal layer may be etched using plasma. The etching chamber (not shown) may use a variety of plasma sources to generate plasma using a process gas, e.g., the plasma sources may be selected from the group consisting of a capacitively coupled plasma (CCP) source, an inductively coupled plasma (ICP) source, a reactive ion etching plasma (RIE) source, a magnetically enhanced reactive ion etch plasma (MERIE) source, and an electron cyclotron resonance (ECR) source.

Figure 9:
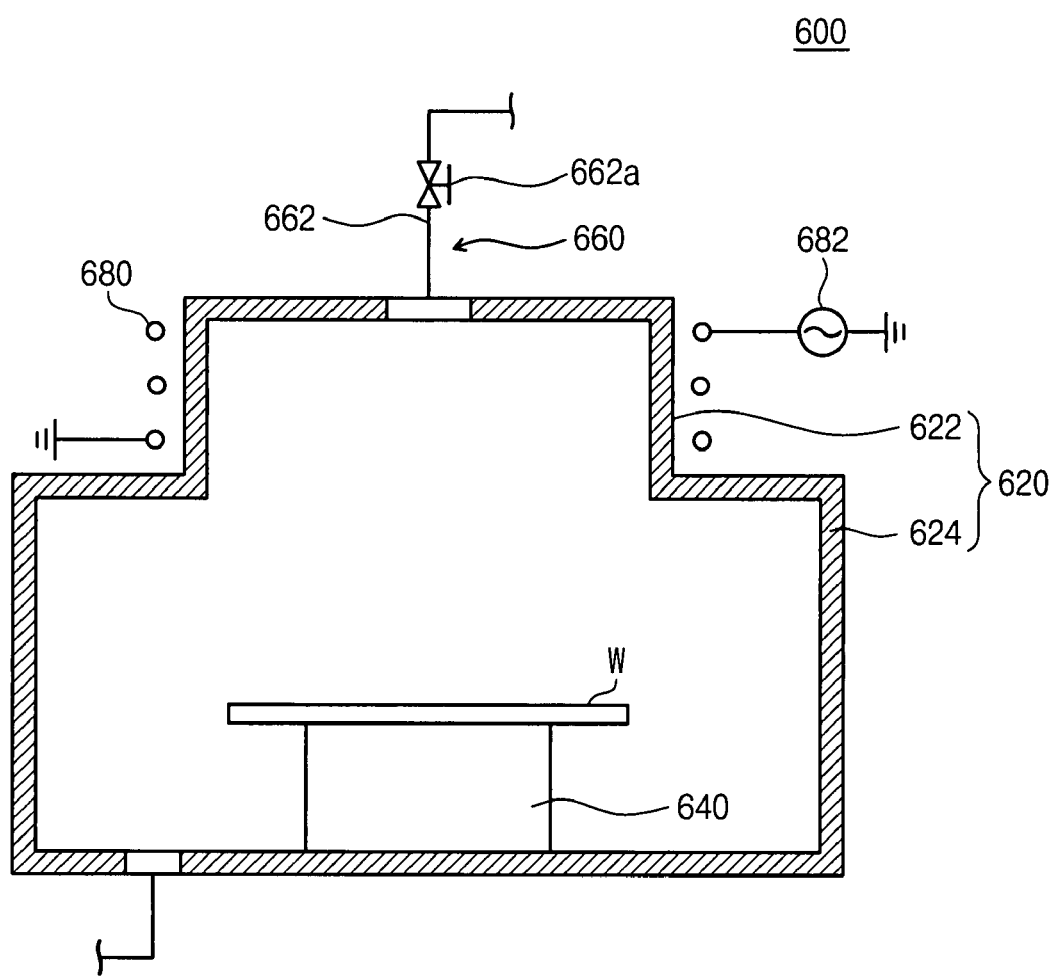
FIG. 9 illustrates a schematic view of an ashing chamber according to an embodiment of the present invention.
Figure 10A:
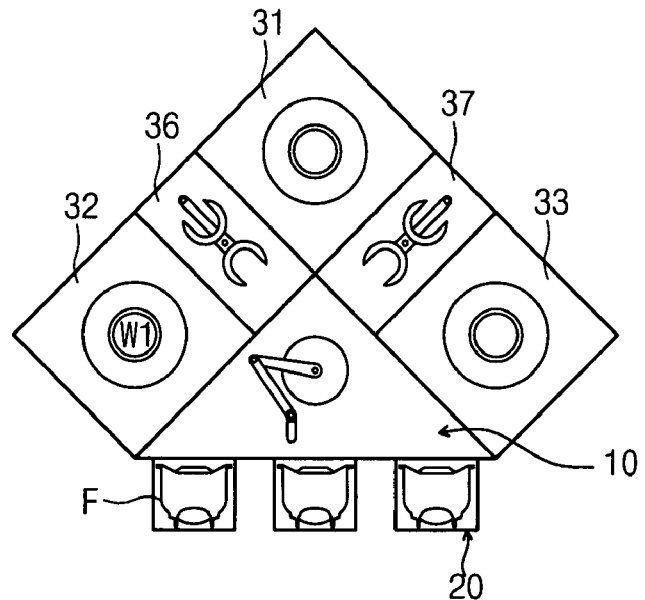
FIGS. 10A-10E illustrate schematic plan views of stages of a wafer transfer path of the substrate treatment apparatus of FIG. 1.
Figure 10B:
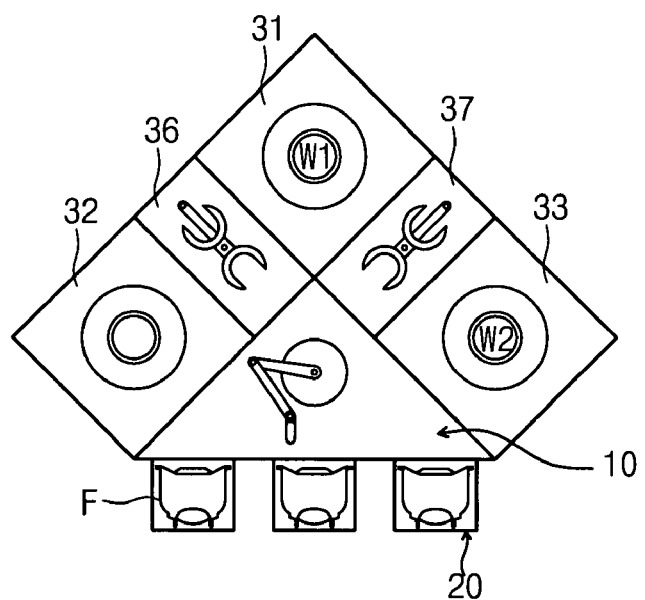
Figure 10C:
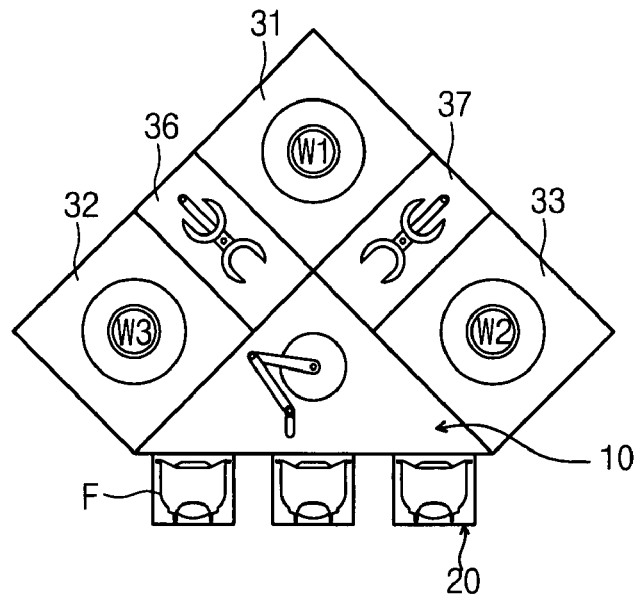
Figure 10D:
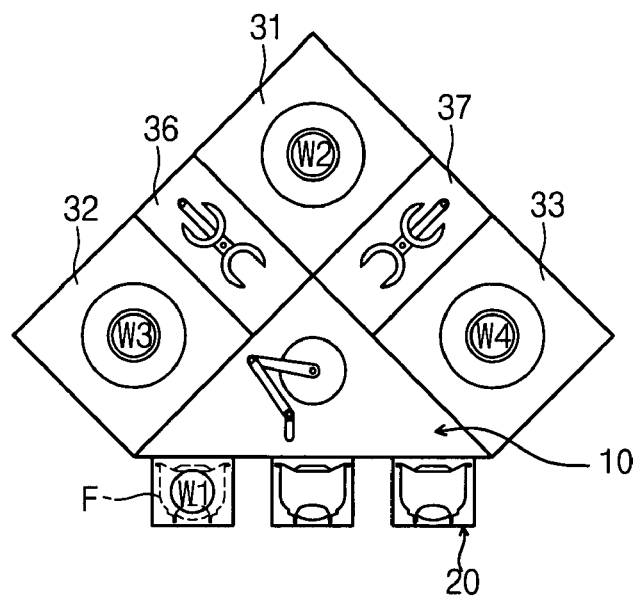
Figure 10E:
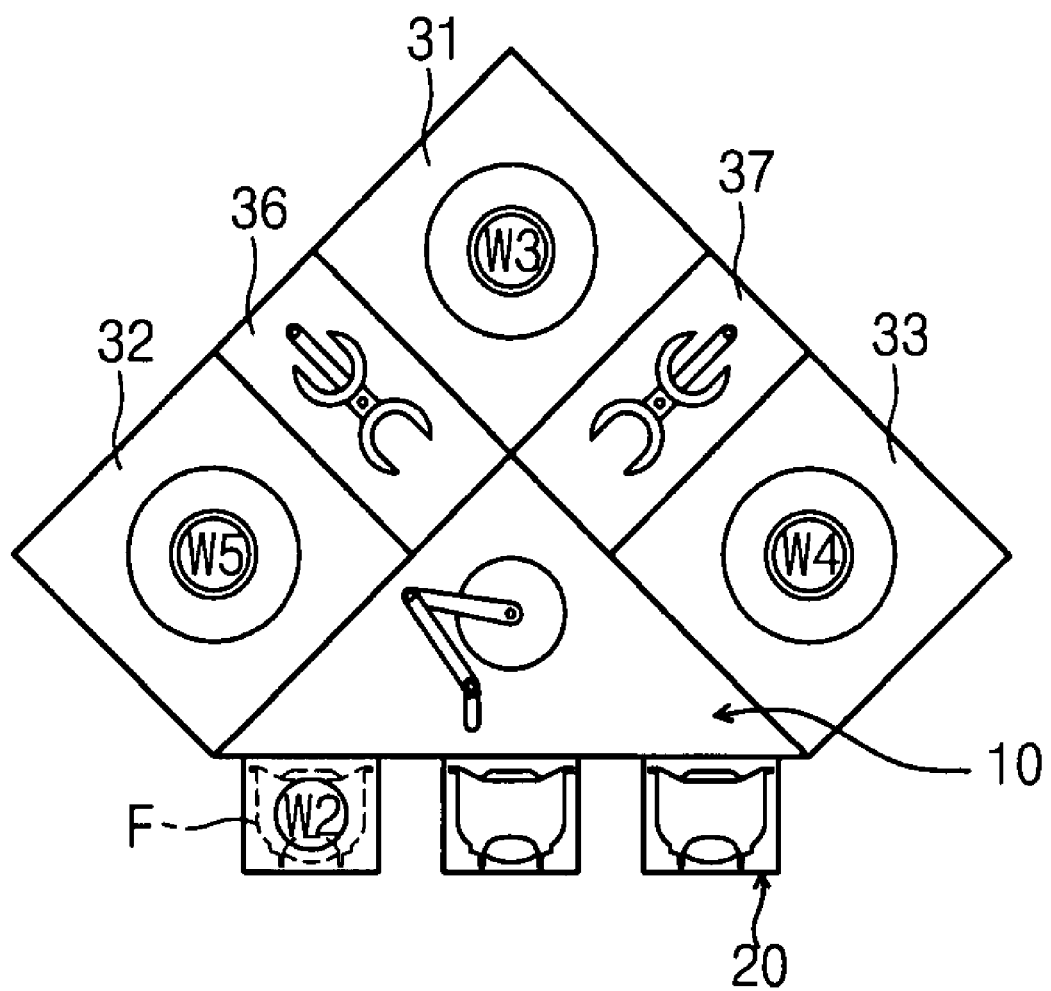

FIG. 9 illustrates a schematic sectional view of an ashing chamber 600 according to an embodiment of the present invention. The ashing chamber 600 may perform the ashing process using an ICP source. Referring to FIG. 9, the ashing chamber 600 may include a housing 620, a supporting member 640, a plasma source, and a process gas supplying member 660. The housing 620 may include upper and lower bodies 622, 624. The interior space of the upper body 622 may be in communication with the interior space of the lower body 624. When viewed from a top, the lower body 624 may be smaller than the upper body 622. The supporting member 640 may be disposed in the lower body 624. The supporting member 640 may support the wafer W during the process. The process gas supplying member 660 may be connected to an upper end of the upper body 622. The process gas supplying member 660 may supply the process gas into the housing 620 and may include a supply pipe 662 and a supply valve 662a. A coil 680 may be provided around the upper body 622. A high frequency may be applied to the coil 680 from a high frequency generator 682. The plasma may be generated from the process gas supplied into the upper body 622. The generated plasma may react with the wafer W disposed on the supporting member 640 in the lower body 624.

A conventional ashing chamber may generate plasma using a microwave, thus, it may be a time-consuming process. Therefore, the conventional substrate treatment apparatus may include a number of etching chambers and a number of ashing chambers, in which the number of etching chambers equals the number of ashing chambers. This may increases the space required to install the conventional apparatus. However, according to the embodiments presented, the ashing chamber 600 that generates plasma using an ICP source may reduce the required process time. Therefore, the apparatuses illustrated in FIGS. 1 and 8, and the principles explained herein, may reduce the number of ashing chambers 600 necessary in a substrate treatment apparatus 1, 2.

When the substrate treatment apparatus 1 is designed as illustrated in FIG. 1, the first process chamber 31 may function as the ashing chamber and the second and third chambers 32, 33 may function as the etching chambers. FIGS. 10A through 10E illustrate schematic plan views of stages in a wafer treatment process using the substrate treatment apparatus of FIG. 1. First, FIG. 10A, the first wafer W1 may be unloaded from the container F and transferred to the second process chamber 32. The etching process may then be performed on the first wafer W1. Next, FIG. 10B, the second wafer W2 may be transferred to the third process chamber 33 and the etching process for the second wafer W2 may be performed. The first wafer W1 may then be transferred from the second process chamber 32 to the first process chamber 31. The ashing process may be performed for the first wafer W1 in the first process chamber 31. The third wafer W3 may be transferred to the second process chamber 32, FIG. 10C, and the etching process may be performed on the third wafer W3 in the second process chamber 32. After this, the first wafer W1 may be unloaded from the first process chamber 31, FIG. 10D, and loaded into the container F. The second wafer W2 may be transferred from the third process chamber 33 to the first process chamber 31 and the fourth wafer W4 may be transferred to the third process chamber 33. The ashing process may be performed on the second wafer W2 in the first process chamber 31 while the etching process may be performed on the fourth wafer W4 in the third process chamber 33. Next, FIG. 10E, the second wafer W2 may be loaded in the container F from the first process chamber 31 and the third wafer W3 may be transferred from the second process chamber 32 to the first process chamber 31. In addition, the fifth wafer W5 may be transferred to the second process chamber 32. The ashing process may then be performed on the third wafer W3 in the first process chamber 31 and the etching process may be performed on the fifth wafer W5 in the second process chamber 32. The above-described processes may be repeated or extended.

Figure 11:
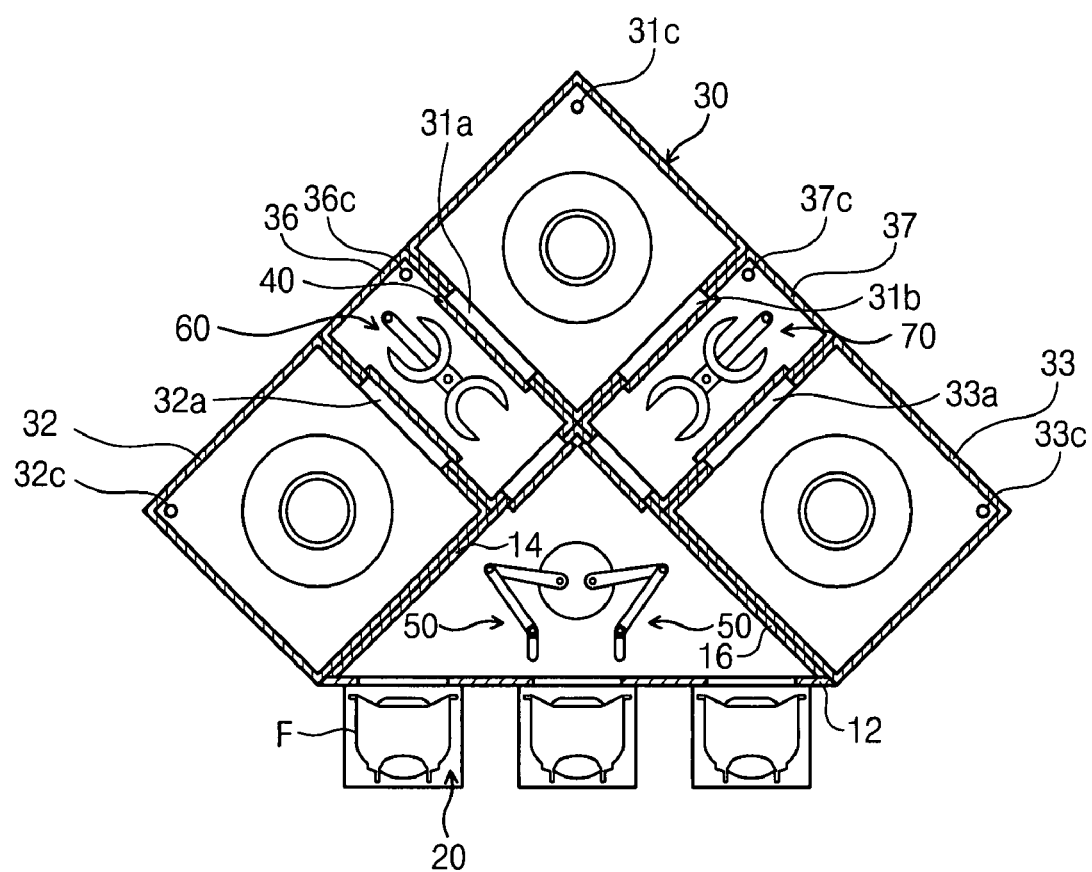
FIG. 11 illustrates a view of a substrate treatment apparatus according to another embodiment of the present invention.

Alternatively, when the substrate treatment apparatus 2 is designed as in FIG. 8, the first process chamber 31 may function as the ashing chamber and the second through fifth process chambers 32 through 35 may function as the etching chambers. Alternatively, the second and third process chambers 32 and 33 may function as the ashing chamber and the first, fourth and fifth process chambers 31, 34, 35 may function as etching chambers. The exemplary embodiments described above, provide illustrations of the wafer transfer module 10 having one module robot 50. However, as illustrated in FIG. 11, two or more module robots 50 may be provided in the wafer transfer module 10.

A wafer transfer module 10 may include a triangular shape and the process room may have a number of chambers arranged along the barrier of the wafer transfer module 10. Thus, the area required to install the substrate treatment apparatus may be reduced.

Additionally, the wafers may be directly transferred between the robot 50 provided in the wafer transfer module 10 and the robot 60, 70 provided in the transfer chamber to transfer the wafers to the process chambers. Thus, there may be no need to provide both a transfer chamber 36, 37 and a load lock chamber. Thus, the area required to install the substrate treatment apparatus may be reduced.

Further, a smaller number of process chambers may be arranged for those parts of the process having relatively short process times. Thus, there may be no need to have an equal number of process chambers for both the first process and the second processes, when the processes may be consecutively performed. Thus, the number of process chambers may be reduced, and the area required to install the substrate treatment apparatus may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A substrate treatment apparatus, comprising:
    a process room including a transfer chamber between at least two process chambers, the transfer chamber providing wafers to the at least two process chambers;
    a load port in which a container receiving wafers is disposed; and
    a wafer transfer module disposed between the load port and the process room to transfer the wafers between the load port and the process room, the wafer transfer module including:
        a first barrier,
        a second barrier extending from a first end of the first barrier at a first predetermined angle with respect to the first barrier, and
        a third barrier extending from a second end of the first barrier at a second predetermined angle with respect to the first barrier, wherein:
    the load port is provided along the first barrier, and the at least two process chambers are arranged on at least one of the second and third barriers,
    the transfer chamber includes an entrance facing the wafer transfer module for receiving wafers from the wafer transfer module,
    the wafer transfer module includes a transfer module robot, the transfer module robot including an arm pivotally coupled to a blade, and
    an end of the second barrier opposite from the first barrier meets with an end of the third barrier opposite from the first barrier, to form a triangle surrounding the arm and the blade of the transfer module robot.

2. The substrate treatment apparatus as claimed in claim 1, wherein the first predetermined angle and the second predetermined angle are equal.

3. The substrate treatment apparatus as claimed in claim 1, wherein the entrance of the transfer chamber which faces the wafer transfer module-includes:
    a gate valve for closing and opening the entrance of the transfer chamber; and
    a vacuum source connected to the transfer chamber to maintain an interior thereof at a predetermined vacuum pressure.

4. The substrate treatment apparatus as claimed in claim 1, further comprising:

a transfer chamber robot in the transfer chamber providing wafers to and receiving wafers from the at least two process chambers; and a transfer module robot in the wafer transfer module providing wafers to the transfer chamber robot, and receiving wafers from the transfer chamber robot and the load port.

5. The substrate treatment apparatus as claimed in claim 4, wherein the transfer module robot has a substantially straight and linear blade on which the wafer is disposed, and the transfer chamber robot has a C-shaped blade on which the wafer is disposed.

6. The substrate treatment apparatus as claimed in claim 4, wherein the arm of transfer module robot comprises:

a lower arm pivotally attached to the substrate treatment apparatus;

an upper arm pivotally coupled to the lower arm, the upper arm being independently driven with respect to the lower arm; and a hand unit pivotally coupled to the upper arm, the hand unit being independently driven with respect to the lower and upper arms, the first, second, and third barriers surrounding the lower arm, the upper arm, and the hand unit of the transfer module robot.

7. The substrate treatment apparatus as claimed in claim 6, wherein the hand unit comprises:

a coupling rod pivotally coupled to the upper arm; and one or more blades provided on respective opposite ends of the coupling rod, on which the wafer is disposed.

8. A substrate treatment apparatus, comprising:

a process room including a plurality of transfer chambers and a plurality of process chambers, at least one transfer chamber of the plurality of transfer chambers providing wafers to at least two process chambers of the plurality of process chambers;

a load port in which a container receiving wafers is disposed; and a wafer transfer module disposed between the load port and the process room to transfer the wafers between the load port and the process room, the wafer transfer module including:

a first barrier, a second barrier extending from a first end of the first barrier at a first predetermined angle with respect to the first barrier, and a third barrier extending from a second end of the first barrier at a second predetermined angle with respect to the first barrier, wherein:

the load port is provided along the first barrier, and at least two process chambers of the plurality of process chambers are arranged on at least one of the second and third barriers, the plurality of transfer chambers each include an entrance facing the wafer transfer module for receiving wafers from the wafer transfer module, and the process room includes:

a first transfer chamber of the plurality of transfer chambers, in which a first robot for transferring the wafers is installed, the first transfer chamber being provided on a side of the second barrier;

a second transfer chamber of the plurality of transfer chambers, in which a second robot for transferring the wafers is installed, the second transfer chamber being provided on a side of the third barrier;

a first process chamber of the plurality of process chambers having a first partition facing the first transfer chamber and a second partition facing the second transfer chamber, the first process chamber receiving wafers from the first and second transfer chambers;

a second process chamber of the plurality of process chambers disposed adjacent the first transfer chamber and opposite the first process chamber, the second process chamber receiving wafers from the first transfer chamber; and a third process chamber of the plurality of process chambers disposed adjacent the second transfer chamber and opposite the first process chamber, the third process chamber receiving wafers from the second transfer chamber.

9. The substrate treatment apparatus as claimed in claim 8, wherein the first partition of the first process chamber, which faces the first transfer chamber, and the second partition of the first process chamber, which faces the second transfer chamber, each include a chamber entrance for the transfer of the wafers into and out of the first process chamber.

10. The substrate treatment apparatus as claimed in claim 9, further comprising:

a controller for controlling the robots provided in the first and second transfer chambers, wherein a first process performed in the second and third process chambers is different from a second process performed in the first process chamber, and the controller controls the robots such that the wafers that are processed in the second and third process chambers are sequentially transferred to the first process chamber.

11. The substrate treatment apparatus as claimed in claim 10, wherein the process room performs two processes consecutively; and the first process chamber performs a shorter process, and the second and third process chambers perform a longer process.

12. The substrate treatment apparatus as claimed in claim 11, wherein the first process chamber performs an ashing process using plasma; and the second and third process chambers perform an etching process.

13. The substrate treatment apparatus as claimed in claim 9, further comprising:

a controller for controlling the robots provided in the first and second transfer chambers, wherein a first process performed in the second and third process chambers is different from a second process performed in the first process chamber, and the controller controls the robots such that the wafers that are processed in the first process chamber are sequentially transferred to the second and third process chambers.

14. The substrate treatment apparatus as claimed in claim 8, wherein the process room further comprises:

a fourth process chamber of the plurality of process chambers disposed on a side of the first transfer chamber opposite the wafer transfer module; and a fifth process chamber disposed on a side of the second process chamber opposite the wafer transfer module.

15. The substrate treatment apparatus as claimed in claim 14, wherein the process room performs two processes consecutively; and the first process chamber performs a shorter process, and the second through fifth process chambers perform a longer process.

16. The substrate treatment apparatus as claimed in claim 14, wherein the first process chamber performs an ashing process using plasma; and the second through fifth process chambers perform an etching process.

17. The substrate treatment apparatus as claimed in claim 14, wherein the process room performs two processes consecutively; and the second and third process chambers perform a shorter process, and the first, fourth and fifth process chambers perform a longer process.

18. The substrate treatment apparatus as claimed in claim 17, wherein the second and third process chambers perform an ashing process using plasma generated by an ICP (Inductively Coupled Plasma) source; and the first, fourth and fifth process chambers perform an etching process.

* * * * *